(12) United States Patent
Niigaki et al.

(10) Patent No.: US 7,586,968 B2
(45) Date of Patent: Sep. 8, 2009

(54) HEATER-ATTACHED ALKALI-ENCAPSULATED CELL AND ALKALI LASER APPARATUS

(75) Inventors: Minoru Niigaki, Hamamatsu (JP); You Wang, Hamamatsu (JP); Yujin Zheng, Hamamatsu (JP); Hirofumi Kan, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 13 days.

(21) Appl. No.: 11/878,745

(22) Filed: Jul. 26, 2007

(65) Prior Publication Data

US 2008/0031299 A1    Feb. 7, 2008

(30) Foreign Application Priority Data

Aug. 1, 2006    (JP)    ............................ P2006-209886

(51) Int. Cl.
*H01S 3/22* (2006.01)
(52) U.S. Cl. .............................. 372/56; 372/55; 372/61
(58) Field of Classification Search ..................... 372/56
See application file for complete search history.

(56) References Cited

U.S. PATENT DOCUMENTS

| | | | |
|---|---|---|---|
| 3,898,494 A * | 8/1975 | Levy ............................. | 313/15 |
| 4,876,690 A * | 10/1989 | Nishida et al. ................. | 372/56 |
| 5,012,479 A * | 4/1991 | Hug et al. ..................... | 372/56 |
| 5,287,370 A * | 2/1994 | Maitland et al. ............... | 372/35 |
| 5,504,770 A * | 4/1996 | Taylor et al. .................. | 372/56 |
| 6,643,311 B2 | 11/2003 | Krupke | |
| 7,106,776 B1 * | 9/2006 | Sorokin et al. ................ | 372/56 |
| 2007/0237191 A1 * | 10/2007 | Kafka et al. ................... | 372/20 |

OTHER PUBLICATIONS

William F. Krupke et al. "Resonance transition 795-nm rubidium laser." *Optics Letters*, vol. 28, No. 23, Dec. 1, 2003, pp. 2336-2338.
William F. Krupke et al. "New class of cw high-power diode-pumped alkali lasers (DPALs)." *Proc. SPIE*, 2004, pp. 5448-5458.
Raymond J. Beach et al., "End-Pumped 895 nm Cs Laser." *Advanced Solid-State Photonics WC4*, 2004.
Raymond J. Beach et al., "End-pumped continuous-wave alkali vapor lasers: experiment, model, and power scaling." *Journal of Optical Society of America*, vol. 21, No. 12, Dec. 2004, pp. 2151-2163.

* cited by examiner

*Primary Examiner*—Minsun Harvey
*Assistant Examiner*—Phillip Nguyen
(74) *Attorney, Agent, or Firm*—Drinker Biddle & Reath LLP

(57) ABSTRACT

An alkali-encapsulated cell internally having an alkali metal vapor G encapsulated is provided with first and second heaters 11, 12. The alkali-encapsulated cell 10 has first and second end faces 10a, 10b opposed to each other, and a side face 10c connecting the two end faces 10a, 10b. Each of the first and second heaters 11, 12 has a covering portion 11B, 12B and an extending portion 11C, 12C. Some portions of the alkali-encapsulated cell 10 are inserted in the covering portions 11B, 12B. On the other hand, the extending portions 11C, 12C extend in directions away from the alkali-encapsulated cell 10. The first and second heaters 11, 12 are separated from each other with a distance $d_0$ between them in an opposing direction of the first and second end faces 10a, 10b.

6 Claims, 11 Drawing Sheets

HEATER-ATTACHED ALKALI-ENCAPSULATED CELL AND ALKALI LASER APPARATUS

BACKGROUND OF THE INVENTION

1. Field of the Invention

The present invention relates to a heater-attached alkali-encapsulated cell and an alkali laser apparatus.

2. Related Background Art

In the field of laser machining such as welding and cutting with a laser beam, there is a demand for a highly-efficient, compact, and inexpensive laser with high output power and high beam quality. An example of the well-known techniques is to condense high-power laser light from a stack of semiconductor laser diode arrays by a lens or the like and use the condensed light. Another known example is to use a high-power laser beam from a solid-state laser pumped by a semiconductor laser.

However, the laser light emitted from the semiconductor laser diode arrays has the problems that its spectral width broadens and that its beam quality is inferior to those of the conventional lamp-pumped Nd:YAG laser and $CO_2$ laser. In the case of the solid-state laser, its laser medium is a solid and it poses the problems such as appearance of refraction index distribution or strain in the medium due to heat or heterogeneity of heat.

In order to solve these problems, alkali metal vapor lasers (hereinafter referred to simply as alkali lasers) are being studied (e.g., cf. Patent Document 1 and Non-patent Documents 1-4). In the alkali lasers, an alkali metal vapor is generated in an alkali-encapsulated cell in which an alkali metal and a buffer gas are encapsulated, by heating the cell with a heater, and it is used as a laser medium. Since the alkali vapor lasers generate less heat in the medium than the solid-state lasers, the problems due to heat are overcome.

[Patent Document 1] U.S. Pat. No. 6,643,311
[Non-patent Document 1] W. F. Klupke et al., Optics Letters, Vol. 28, 2336 (2003)
[Non-patent Document 2] W. F. Klupke et al., Proc. SPIE, 5448 (2004)
[Non-patent Document 3] R. J. Beach et al., Advanced Solid-State Photonics WC4 (2004)
[Non-patent Document 4] R. J. Beach et al., J. Opt. Soc. Am B 21, 2151 (2004)

Problem to be Solved by the Invention

In the alkali lasers described in Non-patent Documents 1-4, however, because the alkali-encapsulated cell is heated to raise the temperature of the alkali metal encapsulated therein, it is necessary to prepare an oven covering the entire alkali-encapsulated cell, or to install a reservoir for reserving the alkali metal, for the alkali-encapsulated cell. For this reason, the configuration of apparatus became extremely complicated.

The present invention has been accomplished in order to solve the above problem and an object of the invention is to provide a heater-attached alkali-encapsulated cell and an alkali laser apparatus capable of heating the alkali-encapsulated cell by a simple configuration.

SUMMARY OF THE INVENTION

Means for Solving the Problem

Incidentally, the Inventor has conducted elaborate research on the alkali-encapsulated cell and alkali laser apparatus and found the following fact. Namely, if the alkali metal is deposited on the end face that the pump light enters and on the end face that the laser light leaves, in the cell in which the alkali metal is encapsulated, the deposited alkali metal directly absorbs the pump light. The Inventor came to find the following fact: it results in heating the end faces, and it could lead to breakage of the cell. Then the Inventor further has studied on the alkali-encapsulated cell having the simple configuration and prevented from the deposition of the alkali metal on the end faces, reaching the present invention.

In light of this research result, a cell for alkali laser apparatus according to the present invention is a heater-attached alkali-encapsulated cell comprising first and second heaters for heating an alkali-encapsulated cell in which an alkali metal vapor is encapsulated, the alkali-encapsulated cell having first and second end faces opposed to each other and transmitting pump light for pumping the alkali metal vapor, and laser light outputted from the alkali metal vapor pumped, and a side face connecting the two end faces; wherein a penetrating space extending from one end to another end is formed in each of the first and second heaters; wherein the first heater is so arranged that a portion on the first end face side of the alkali-encapsulated cell is inserted in a part of the penetrating space of the first heater and that the rest thereof extends toward a side opposite to the second end face with respect to the first end face; and wherein the second heater is separated from the first heater with a predetermined distance between the heaters in an opposing direction of the first and second end faces and is so arranged that a portion on the second end face side of the alkali-encapsulated cell is inserted in a part of the penetrating space of the second heater and that the rest thereof extends toward a side opposite to the first end face with respect to the second end face.

The foregoing heater-attached alkali-encapsulated cell comprises the heaters having their respective penetrating spaces and is arranged in such a configuration that the portions of the cell are merely inserted in the parts of the penetrating spaces. Therefore, the alkali-encapsulated cell can be heated in the simple configuration. In the heater-attached alkali-encapsulated cell, the first and second heaters are so arranged that only the portions of the alkali-encapsulated cell are inserted in the penetrating spaces and that they are separated from each other with the predetermined distance between them in the opposing direction of the first and second end faces of the cell. The cell has a portion not covered by the heaters, in a region apart from the end faces. Therefore, it is easy to control heat applied to the cell so that a temperature of the portion not covered by the heaters becomes lower than temperatures at the end faces, and it becomes feasible to prevent the alkali metal from being deposited on the end faces in the alkali-encapsulated cell. In addition, each heater has the part in which the alkali-encapsulated cell is not inserted in the internal penetrating space and which extends away from the end face of the alkali-encapsulated cell. Since heat generated from these parts is further applied to each end face, it becomes feasible to prevent the alkali metal more effectively from being deposited on the end faces.

Preferably, the alkali-encapsulated cell further comprises a pair of spacers having thermal conductivity and elasticity and fitted in a space between internal walls of the respective heaters defining the penetrating spaces, and the side face of the alkali-encapsulated cell. Since the spacers fitted in the space between the alkali-encapsulated cell and the heaters have elasticity, adhesion is improved between the cell and the spacers and between the spacers and the heaters. As the spacers with thermal conductivity enhance the adhesion to the cell and to the heaters in this configuration, the alkali-encapsulated cell can be efficiently heated by the heaters.

Preferably, the alkali-encapsulated cell further comprises a pair of end face heaters for heating the respective end faces of the alkali-encapsulated cell. In this case, a temperature distribution can be realized with better uniformity on the end faces.

Preferably, the first and second end faces both are circular; a length of the rest of the first heater in an extending direction of the penetrating space is not less than 0.5 times and not more than 1.5 times a diameter of the first end face; a length of the rest of the second heater in an extending direction of the penetrating space is not less than 0.5 times and not more than 1.5 times a diameter of the second end face. In this case, the heaters are prevented from blocking the pump light to irradiate the alkali metal vapor in the alkali-encapsulated cell, and each end face can be suitably heated across the entire surface.

An alkali laser apparatus according to the present invention is an alkali laser apparatus comprising: a cavity having on a resonance path a heater-attached alkali-encapsulated cell; and a pump light emitter for emitting the pump light to irradiate the alkali metal vapor, wherein the heater-attached alkali-encapsulated cell comprising first and second heaters for heating an alkali-encapsulated cell in which an alkali metal vapor is encapsulated, the alkali-encapsulated cell having first and second end faces opposed to each other and transmitting pump light for pumping the alkali metal vapor, and laser light outputted from the alkali metal vapor pumped, and a side face connecting the two end faces; wherein a penetrating space extending from one end to another end is formed in each of the first and second heaters; wherein the first heater is so arranged that a portion on the first end face side of the alkali-encapsulated cell is inserted in a part of the penetrating space of the first heater and that the rest thereof extends toward a side opposite to the second end face with respect to the first end face; and wherein the second heater is separated from the first heater with a predetermined distance between the heaters in an opposing direction of the first and second end faces and is so arranged that a portion on the second end face side of the alkali-encapsulated cell is inserted in a part of the penetrating space of the second heater and that the rest thereof extends toward a side opposite to the first end face with respect to the second end face.

The aforementioned heater-attached alkali-encapsulated cell is arranged so that the alkali-encapsulated cell can be heated in the simple configuration. Since the alkali laser apparatus uses the alkali metal vapor as a laser medium, it generates less heat than the solid-state lasers and thus suppresses occurrence of the problem due to heat. Therefore, the above-described alkali laser apparatus can realize a high-power, compact laser apparatus, while suppressing the occurrence of the problem due to heat.

In this case, preferably, the pump light emitter has: a light source comprised of a semiconductor laser; a condenser optical system for condensing light emitted from the light source; a rotating optical system for rotating the light condensed by the condenser optical system; and a volume Bragg grating for narrowing a width of a wavelength spectrum of the light rotated by the rotating optical system.

EFFECT OF THE INVENTION

The present invention successfully provides the heater-attached alkali-encapsulated cell and alkali laser apparatus capable of heating the alkali-encapsulated cell by the simple configuration.

DESCRIPTION OF THE PREFERRED EMBODIMENTS

Best Mode for Carrying Out the Invention

The preferred embodiments will be described below in detail with reference to the accompanying drawings. In the description the same elements or elements with the same functionality will be designated by the same reference symbols, without redundant description.

Figure 1:
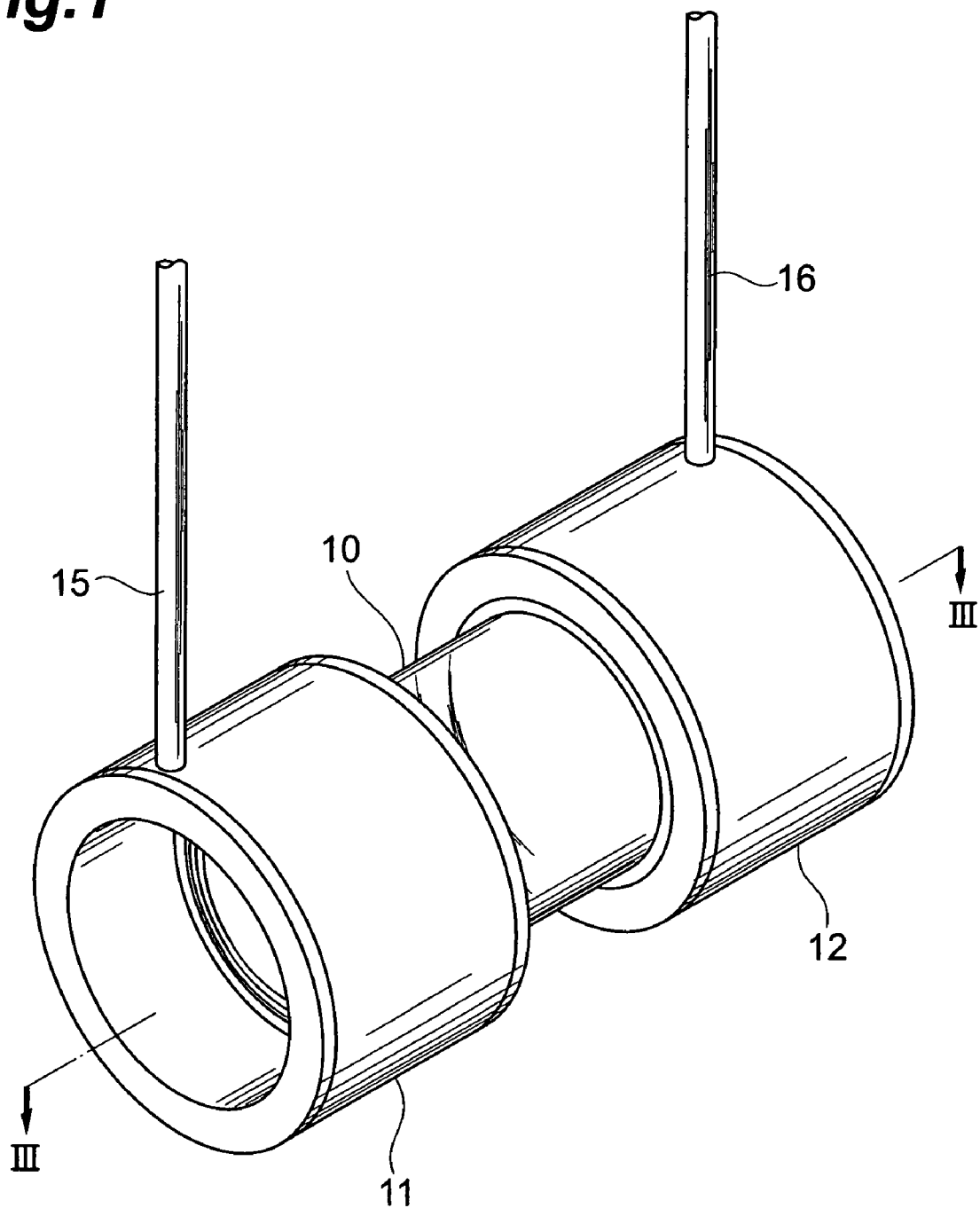
FIG. 1 is a perspective view of a heater-attached alkali-encapsulated cell according to an embodiment.
Figure 2:
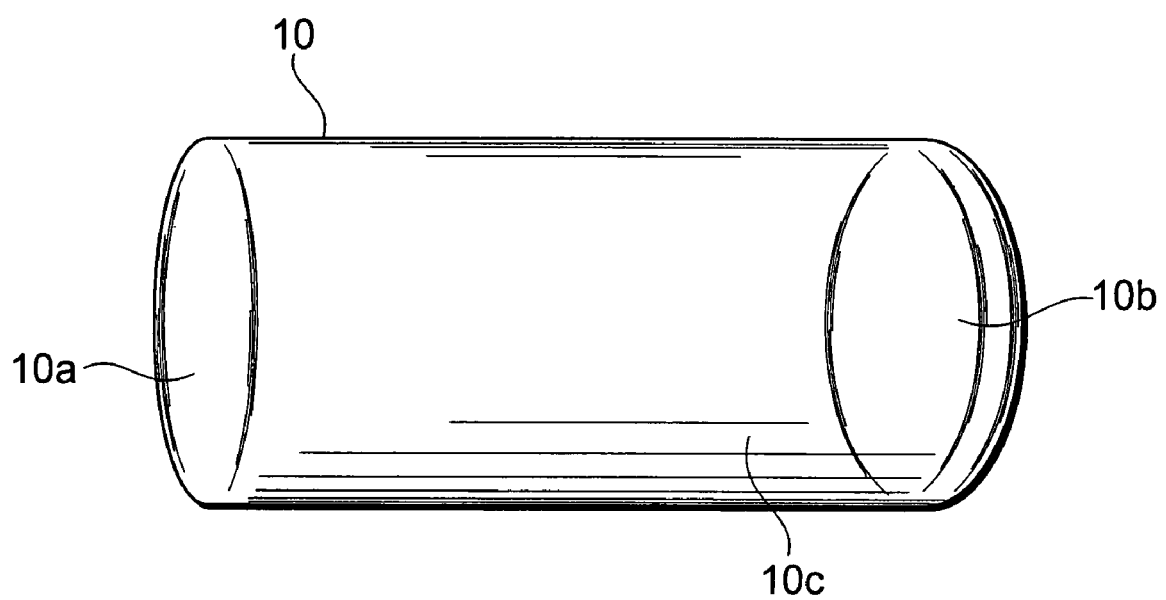
FIG. 2 is a perspective view of an alkali-encapsulated cell according to the embodiment.
Figure 3:
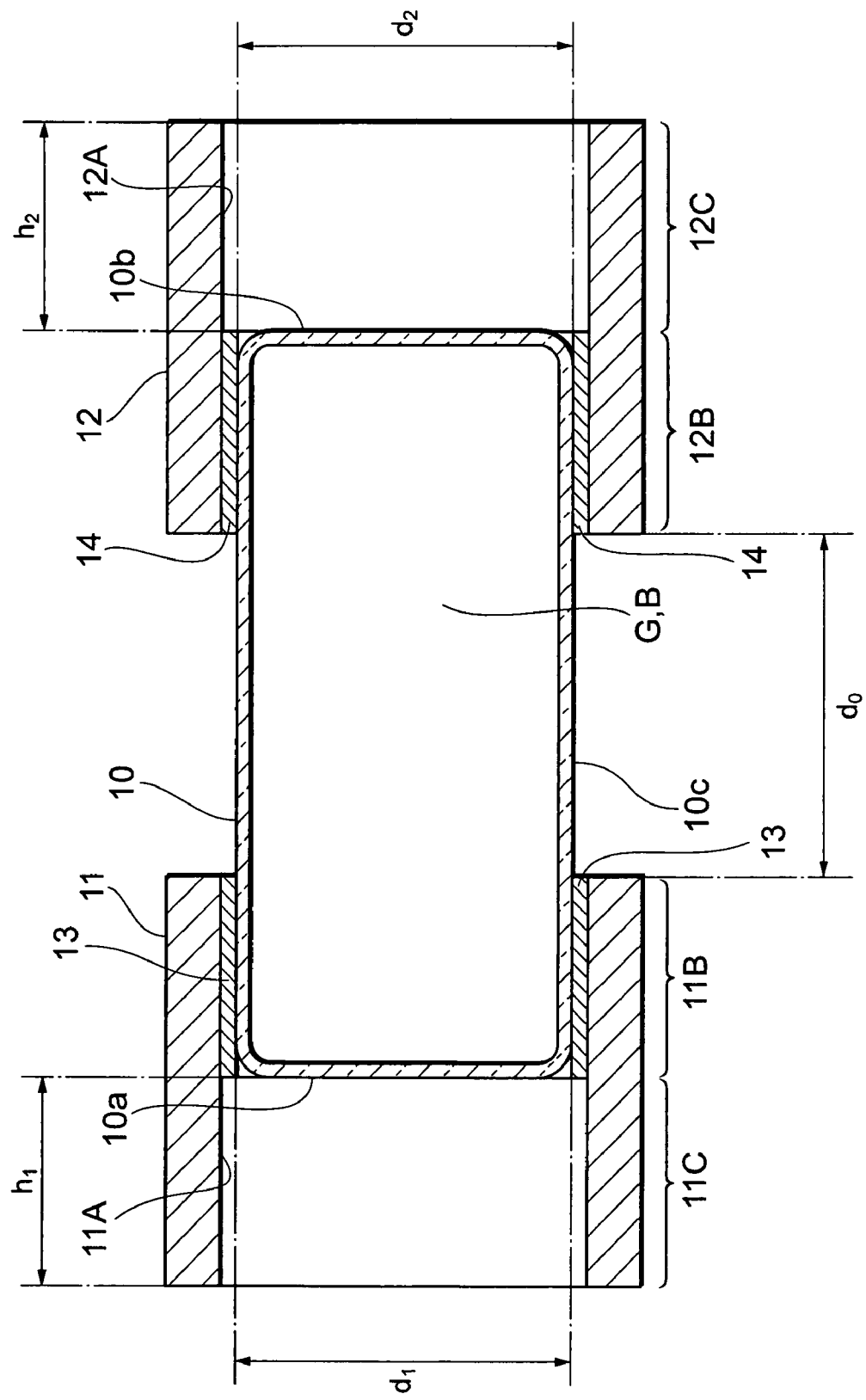
FIG. 3 is a sectional view along line III-III and in an arrow direction of the heater-attached alkali-encapsulated cell of FIG. 1.

A configuration of a heater-attached alkali-encapsulated cell 10 according to an embodiment of the present invention will be described with reference to FIGS. 1-3. FIG. 1 is a perspective view of the heater-attached alkali-encapsulated cell according to the embodiment. FIG. 2 is a perspective view of the alkali-encapsulated cell according to the embodiment. FIG. 3 is a sectional view along line III-III and in an arrow direction of the heater-attached alkali-encapsulated cell of FIG. 1.

The alkali-encapsulated cell 10 contains an alkali metal (e.g., Li, Na, K, Rb, Cs, or the like) and a buffer gas (e.g., He, Ar, Kr, Ne, Xe, or the like) B internally encapsulated under a predetermined pressure. The alkali-encapsulated cell 10 is equipped with first and second heaters 11, 12 for heating the cell 10, and a pair of spacers 13, 14 fitted between the alkali-encapsulated cell 10 and the first and second heaters 11, 12. These heaters 11, 12 heat the cell 10 to raise its temperature to a predetermined temperature whereby, for example, the solid alkali metal in the alkali-encapsulated cell 10 generates alkali metal vapor G. This results in encapsulating the alkali metal vapor G in the alkali-encapsulated cell 10.

The alkali-encapsulated cell 10 is, for example, an airtight container of glass. The alkali-encapsulated cell 10 has circular first and second end faces 10a, 10b opposed to each other, and a side face 10c connecting these two end faces 10a, 10b. A projection (not shown) for introduction of the alkali metal and buffer gas into the cell may be formed in a part (e.g., the side face 10c, or the like) of the alkali-encapsulated cell 10.

A penetrating space 11A or 12A extending from one end to the other end is formed in each of the first and second heaters 11, 12. The first and second heaters 11, 12 are, for example, ovens and can be controlled in temperature independently of each other. In the first and second heaters 11, 12, an unrepresented temperature controller controls the temperature for heating the cell 10, independently of each other. The heaters are connected through respective leads 15, 16 to a power supply or the like (not shown) for actuating the first and second heaters 11, 12. For example, a thermocouple or the like (not shown) is located on an inner wall of each heater 11, 12.

The first heater 11 has a covering portion 11B and an extending portion 11C. A portion on the first end face 10a side of the alkali-encapsulated cell 10 is inserted in the penetrating space 11A of the covering portion 11B being a part of the first heater 11. The penetrating space 11A of the extending portion 11C, which is the rest part except the covering portion 11B of the first heater 11, extends from the position of the first end face 10a toward the side opposite to the second end face 10b.

A length $h_1$ in the extending direction of the penetrating space 11A, of the extending portion 11C of the first heater 11 is preferably not less than 0.5 times and not more than 1.5 times a diameter (outside diameter) $d_1$ of the first end face 10a.

The second heater 12 has a covering portion 12B and an extending portion 12C. A portion on the second end face 10b side of the alkali-encapsulated cell 10 is inserted in the penetrating space 12A of the covering portion 12B being a part of the second heater 12. The penetrating space 12A of the extending portion 12C, which is the rest part except the covering portion 12B of the second heater 12, extends from the position of the second end face 10b toward the side opposite to the first end face 10a.

A length $h_2$ in the extending direction of the penetrating space 12A, of the extending portion 12C of the second heater 12 is preferably not less than 0.5 times and not more than 1.5 times a diameter (outside diameter) $d_2$ of the second end face 10b.

The first and second heaters 12, 13 are separated from each other with a distance $d_0$ between them in the opposing direction of the first and second end faces 10a, 10b of the alkali-encapsulated cell 10.

The spacers 13, 14 have thermal conductivity and elasticity. The spacers 13, 14 preferably have the thermal conductivity higher than the alkali-encapsulated cell 10. The spacer 13 is fitted in a space between the inner wall of the first heater 11 defining the penetrating space 11A of the first heater 11 and the side face 10c of the alkali-encapsulated cell 10. The spacer 14 is fitted in a space between the inner wall of the second heater 12 defining the penetrating space 12A of the second heater 12 and the side face 10c of the alkali-encapsulated cell 10. The spacers 13, 14 are made, for example, of graphite.

The heater-attached alkali-encapsulated cell 10 may be further provided with a pair of end face heaters (not shown) for applying heat to each end face 10a, 10b. In this case, the end face heaters used herein are, for example, heat guns or the like.

Figure 4:
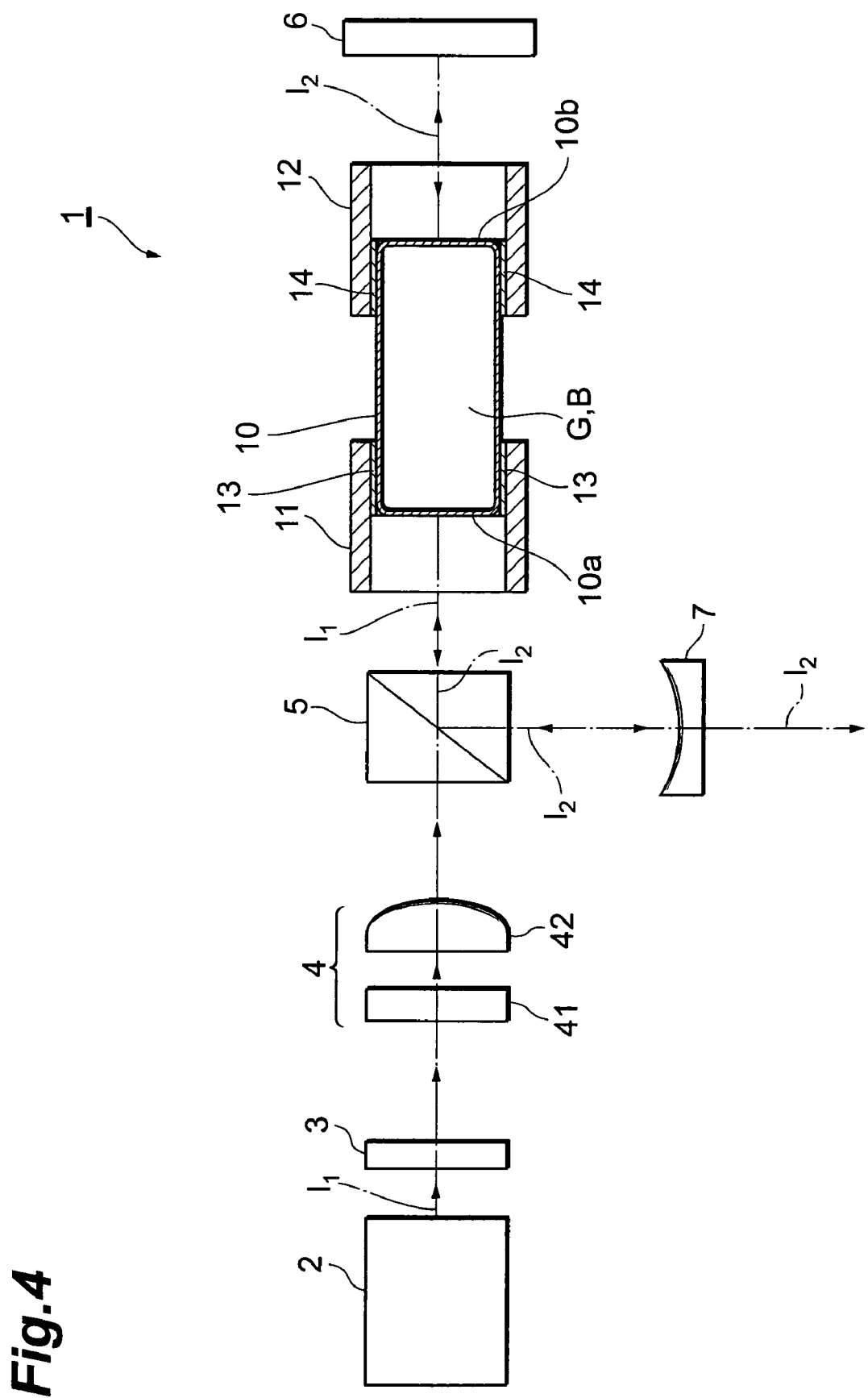
FIG. 4 is a configuration diagram of an alkali laser apparatus according to an embodiment.
Figure 5:
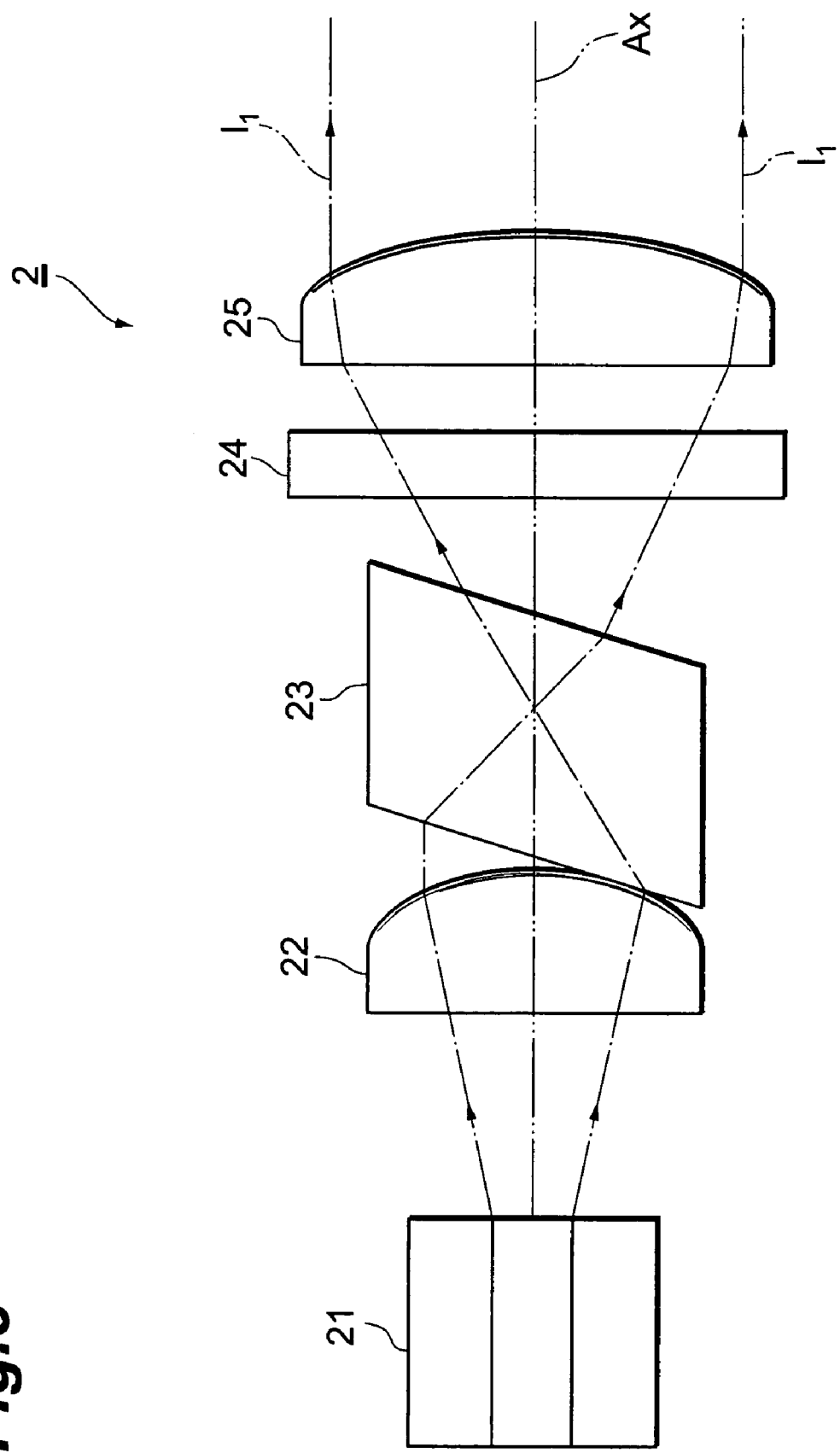
FIG. 5 is a configuration diagram of a pump light emitter used in the alkali laser apparatus shown in FIG. 4.

An embodiment of alkali laser apparatus 1 with the heater-attached alkali-encapsulated cell 10 will be described below with reference to FIGS. 4 and 5. FIG. 4 is a configuration diagram of the embodiment of the alkali laser apparatus. FIG. 5 is a configuration diagram of a pimp light emitter used in the alkali laser apparatus shown in FIG. 4. In the alkali laser apparatus 1, pump light $l_1$ is led to irradiate the alkali metal vapor G in the alkali-encapsulated cell 10 whereby laser light $l_2$ is outputted. Beams of the pump light $l_1$ and the laser light $l_2$ are indicated by chain lines.

The alkali laser apparatus 1 is provided with a pump light emitter 2, a half wave plate 3, a condenser optical system 4, a polarization beam splitter 5, the heater-attached alkali-encapsulated cell 10, a mirror 6, and an output coupler 7. The pump light emitter 2 outputs the pump light $l_1$ to irradiate the alkali metal vapor G encapsulated in the alkali-encapsulated cell 10. The pump light $l_1$ emitted from the pump light emitter 2 is pump light whose wavelength is approximately coincident with an absorption spectrum of the alkali metal atoms in the alkali-encapsulated cell 10.

The half wave plate 3 rotates the polarization of the pump light $l_1$ by 90°. The condenser optical system 4 has two condenser lenses 41, 42. The condenser lens 41 converges the incident pump light $l_1$ in the direction perpendicular to the plane of FIG. 4. The condenser lens 42 converges the incident pump light $l_1$ in the direction perpendicular to the optical axis of the pump light $l_1$ in a plane parallel to the plane of FIG. 4.

The polarization beam splitter 5 separates the pump light $l_1$ and the laser light $l_2$ from each other. Namely, the polarization beam splitter transmits the pump light $l_1$ but reflects the laser light $l_2$.

The mirror 6 and output coupler 7 constitute a cavity. The heater-attached alkali-encapsulated cell 10 is located on a resonance path of the cavity constituted by the mirror 6 and output coupler 7. Namely, the mirror 6 is located on the second end face 10b side of the heater-attached alkali-encapsulated cell 10. The output coupler 7 is located on the optical path of the laser light $l_2$ reflected by the polarization beam splitter 5.

FIG. 5 shows the detailed configuration of the pump light emitter 2. The pump light emitter 2, as shown in FIG. 5, is provided with a semiconductor laser array 21 for emitting laser light, which is the pump light $l_1$ of the alkali laser apparatus 1, a FAC (Fast Axis Collimator) lens 22, a beam rotating lens (rotating optical system) 23, a volume Bragg grating 24, and a SAC (Slow Axis Collimator) lens 25.

The semiconductor laser array 21 is an array in which semiconductor laser chips are one-dimensionally arranged in a bar shape, e.g., 1 cm wide. However, FIG. 5 shows only one semiconductor laser chip as a representative in the semiconductor laser array 21. The semiconductor laser array 21 emits a laser beam as the pump light $l_1$ along the optical axis Ax. The FAC lens 22 converts the laser beam (pump light $l_1$) diverging vertically and horizontally, into a parallel beam in the fast-axis direction. The fast-axis direction corresponds to the vertical direction in FIG. 5, i.e., the direction perpendicular to the optical axis Ax in the plane of FIG. 5.

The beam rotating lens 23 is a lens for rotating the beam by 90°. The volume Bragg grating 24 is an element for narrowing the wavelength band of the light emitted from the semiconductor laser array 21.

The SAC lens 25 is a lens for converting the laser beam (pump light $l_1$) rotated 90° by the beam rotating lens 23, into a parallel beam in the slow-axis direction. Since the beam is rotated 90° by the beam rotating lens 23, the slow-axis direction corresponds to the vertical direction in FIG. 5. Therefore, the FAC lens 22 and SAC lens 25 constitute a condenser optical system.

Next, the operation of the alkali laser apparatus 1 will be described. First, the alkali metal and the buffer gas B are encapsulated in the alkali-encapsulated cell 10. The alkali-encapsulated cell 10 is heated up to the predetermined temperature by the heaters 11, 12 to generate the alkali metal vapor G in the cell.

The pump light $l_1$, which is the laser light emitted from the semiconductor laser array 21, passes through the FAC lens 22, beam rotating lens 23, volume Bragg grating 24, and SAC lens 25. This results in outputting the pump light $l_1$ as a nearly parallel beam from the pump light emitter 2.

The pump light $l_1$ further passes through the half wave plate 3 and condenser optical system 4. Furthermore, the pump light $l_1$ passes through the polarization beam splitter 5. The polarization beam splitter 5 transmits the pump light $l_1$ polarized in a predetermined direction.

The pump light $l_1$ transmitted by the polarization beam splitter 5 is incident to the first end face 10a of the alkali-encapsulated cell 10. The pump light $l_1$ incident into the alkali-encapsulated cell 10 is absorbed by the alkali metal vapor G in the cell 10. The buffer gas B encapsulated in the alkali-encapsulated cell 10 increases the width of the absorption spectrum of the pump light by the alkali metal G. As the alkali metal vapor G absorbs the pump light $l_1$, it is excited into an excited state.

The pump light $l_1$ not absorbed by the alkali metal vapor G emerges from the second end face 10b of the alkali-encapsulated cell 10 and is then reflected on the mirror 6. The pump light $l_1$ reflected by the mirror 6 is again incident to the second end face 10b of the alkali-encapsulated cell 10. The pump light $l_1$ again incident into the alkali-encapsulated cell 10 is absorbed by the alkali metal vapor G in the cell 10. The pump light $l_1$ not absorbed by the alkali metal vapor G emerges from the first end face 10a of the alkali-encapsulated cell 10.

As the alkali metal vapor G in the alkali-encapsulated cell 10 absorbs the pump light $l_1$, the alkali metal vapor G turns into a population inversion state necessary for lasing, to cause stimulated emission of light of a specific wavelength. Specifically, when the alkali metal atoms absorb the pump light $l_1$, they are excited from the ground state $E_0$ ($^2S_{1/2}$) into an excited state $E_2$ ($^2P_{3/2}$). The excited alkali metal atoms are then relaxed into another excited state $E_1$ ($^2P_{1/2}$) and finally transit from the excited state $E_1$ ($^2P_{1/2}$) to the ground state $E_0$ ($^2S_{1/2}$). The stimulated emission takes place during the transition to induce lasing as described below.

While the stimulated emission radiation propagates in the alkali-encapsulated cell 10, stimulated emission occurs to amplify light. The amplified light is resonated by the mirror 6 and output coupler 7 and then outputted as the laser light 12 from the output coupler 7.

The heater-attached alkali-encapsulated cell 10 is arranged with the heaters 11, 12 having the penetrating spaces 11A, 12A so that some portions of the cell 10 are merely inserted in the penetrating spaces 11A, 12A of the covering portions 11B, 11C. Therefore, the alkali-encapsulated cell 10 can be heated by the simple configuration, for example, when compared with a configuration wherein the entire alkali-encapsulated cell is covered by an oven.

Since the alkali-encapsulated cell 10 can be heated by the simple configuration, the temperature of the alkali-encapsulated cell 10 can be controlled readily and precisely, when compared with a configuration wherein the cell of complicated shape is used, e.g., the case using the reservoir.

Each of the first and second heaters 11, 12 is arranged so that only a portion of the alkali-encapsulated cell 10 is inserted in the penetrating space thereof. Furthermore, the first and second heaters 11, 12 are separated from each other with the distance $d_0$ between them in the opposing direction of the first and second end faces 10a, 10b of the alkali-encapsulated cell 10. For this reason, the alkali-encapsulated cell 10 has the portion not covered by the heaters 11, 12, in the central region apart from both of the first and second end faces 10a, 10b. Therefore, it is easy to control the first and second heaters 11, 12 so that the temperature of the portion not covered by the heaters 11, 12, i.e., the central region in the longitudinal direction of the alkali-encapsulated cell 10 becomes lower than the temperatures near the end faces 10a, 10b, in the alkali-encapsulated cell 10.

Figures 6A, 6B:
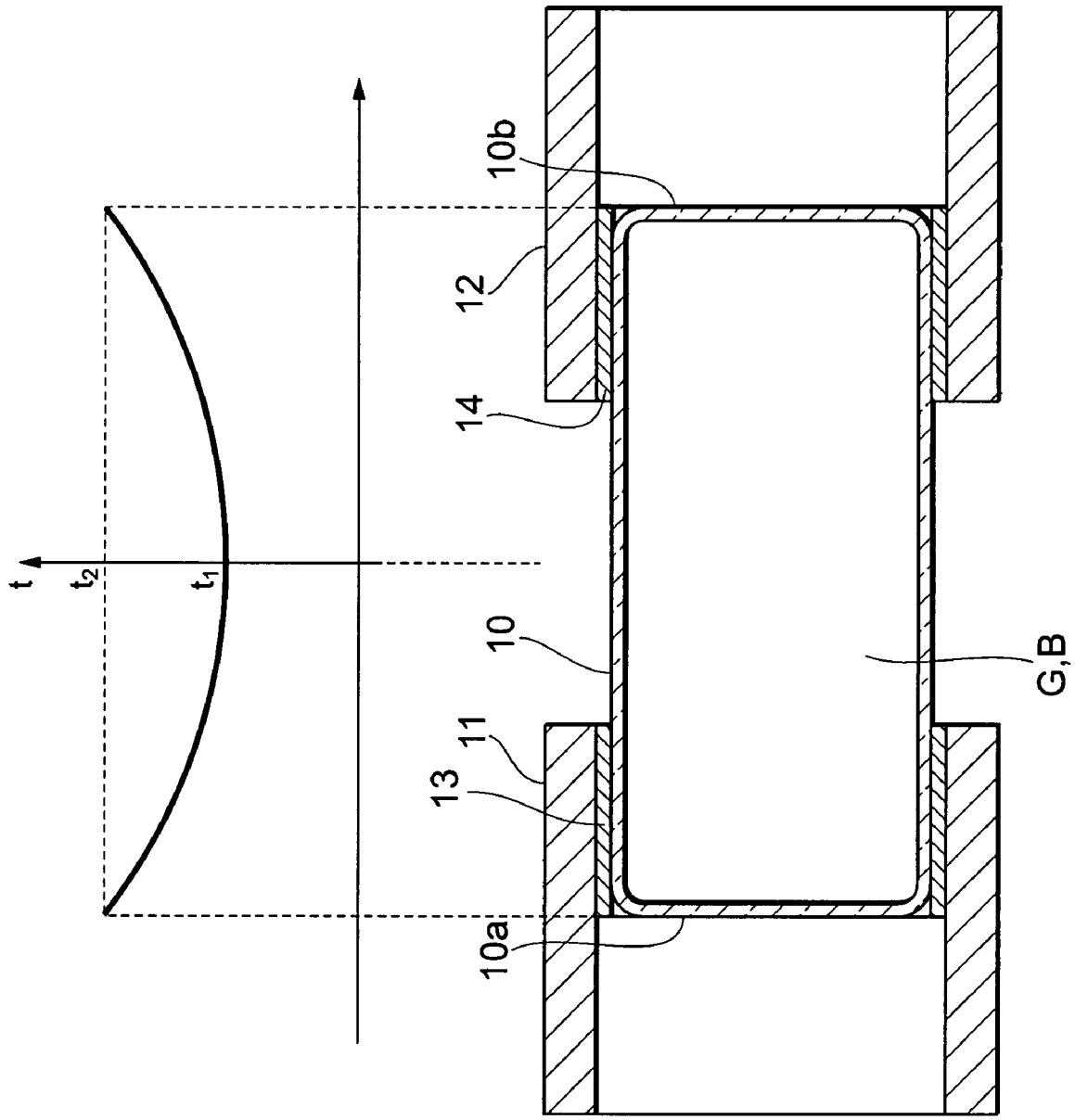
FIG. 6A and FIG. 6B are drawings for explaining a temperature distribution in the heater-attached alkali-encapsulated cell according to the embodiment.

FIG. 6A and FIG. 6B show a temperature distribution in the alkali-encapsulated cell 10. FIG. 6A and FIG. 6B are drawings for explaining the temperature distribution in the alkali-encapsulated cell 10 resulting from the control of the first and second heaters 11, 12, in correspondence to the alkali-encapsulated cell 10. FIG. 6A is a graph showing the temperature distribution in the alkali-encapsulated cell 10, and FIG. 6B a sectional view of the alkali-encapsulated cell. The horizontal axis of the graph of FIG. 6A represents positions in the longitudinal direction of the alkali-encapsulated cell 10, and the vertical axis of the graph of FIG. 6A temperatures at respective positions. As shown in FIG. 6A and FIG. 6B, since the first and second heaters 11, 12 are separated from each other by the distance $d_0$ in the alkali-encapsulated cell 10 with the first and second heaters 11, 12, the temperatures can be controlled so that the temperature $t_2$ near the end faces 10a, 10b becomes higher than the temperature $t_1$ near the central region in the longitudinal direction.

The alkali-encapsulated cell 10 is normally filled with the alkali metal in an amount more than enough to generate the saturated vapor of the alkali metal at a predetermined temperature. Therefore, an excess of the alkali metal at the predetermined temperature will be deposited as a solid over a region at a low temperature in the alkali-encapsulated cell 10. For this reason, if the temperature near the first end face 10a or the second end face 10b is lower than the temperature near the central region, the alkali metal will be deposited as a solid on the first end face 10a or on the second end face 10b. The deposited alkali metal solid will absorb the pump light $l_1$ to generate heat, and it could break the end face 10a, 10b with the alkali metal thereon. Particularly, the alkali metal has the vapor pressure higher than the other metals, and thus the solid alkali metal tends to adhere intensively to low-temperature regions. Hence, the problem of temperature control is significant. If the output of the pump light emitter 2 is increased in order to increase the output of the alkali laser apparatus 1, it will lead to further increase of the heat generated from absorption of the pump light $l_1$ by the deposited alkali metal. This will further increase the temperature of heating the end faces by the deposited alkali metal, and thus increase the possibility of breakage of the end faces.

For solving the problem, in the conventional configuration wherein the cell is heated by covering the entire alkali-encapsulated cell, the cell is covered except for the entrance face and the exit face for pump light (corresponding to the first and second end faces 10a, 10b). Furthermore, the conventional technology involves no consideration to the temperature distribution of the alkali-encapsulated cell 10, i.e., decrease in the temperature difference between the entrance and exit faces for pump light (first and second end faces 10a, 10b) and the central region. Therefore, in the conventional configuration wherein the oven covers the entire alkali-encapsulated cell, the alkali metal is deposited on the entrance and exit faces for pump light (first and second end faces 10a, 10b), which could break the alkali-encapsulated cell 10.

On the other hand, since the heater-attached alkali-encapsulated cell 10 according to the present embodiment is able to readily control the heating of the cell 10 by the first and second heaters 11, 12 so that the temperatures near the end faces 10a, 10b become higher than the temperature near the central region in the longitudinal direction, it becomes feasible to suppress occurrence of breakage of the alkali-encapsulated cell 10.

Since the alkali metal is well prevented from being deposited on the end faces 10a, 10b, the alkali laser apparatus 1 becomes able to operate on a stable basis.

The temperature distribution in the longitudinal direction of the alkali-encapsulated cell 10 (the opposing direction of the first and second end faces 10a, 10b) can be controlled by changing the distance $d_0$ between the first and second heaters 11, 12.

As for the temperature distribution on each end face 10a, 10b, it is considered that there is a temperature difference between the central region far from the heaters 11, 12 and the peripheral region close to the heaters 11, 12. Particularly, supposing the first and second heaters 11, 12 have only the covering portions 11B, 12B without the extending portions 11C, 12C, respectively, the temperature difference due to the distance difference will remain as it is, and the temperature of the central region of each end face 10a, 10b will be lower than the temperature of the peripheral region. The pump light $l_1$ normally enters or emerges from near the central region of each end face 10a, 10b. For this reason, if the alkali metal is deposited on the central region of each end face 10a, 10b, the pump light $l_1$ will come to irradiate it. Since the deposited alkali metal absorbs the pump light $l_1$ to generate heat, the possibility of breakage of the end faces 10a, 10b will increase in this case.

Concerning the alkali-encapsulated cell 10 with the first and second heaters 11, 12 according to the present embodiment, the first and second heaters 11, 12 both have their respective extending portions 11C, 12C in which the alkali-encapsulated cell 10 is not inserted in the internal penetrating space 11A, 12A and which extend so as to depart from the end faces 10a, 10b of the alkali-encapsulated cell 10, i.e., so as to project from the end faces 10a, 10b of the alkali-encapsulated cell 10. The heat generated from these extending portions 11C, 12C is further applied to each end face 10a, 10b of the alkali-encapsulated cell 10. This permits the temperature difference to be reduced between the central region and the peripheral region in each end face 10a, 10b. As a result, it becomes feasible to prevent the alkali metal more effectively from being deposited on the first and second end faces 10a, 10b.

Particularly, it is preferable to use the end face heaters (e.g., heat guns or the like) for applying heat to the respective end faces 10a, 10b, to heat the central regions of the respective end faces 10a, 10b. In this case, each end face 10a, 10b can have the temperature distribution with better uniformity.

Figure 7A:
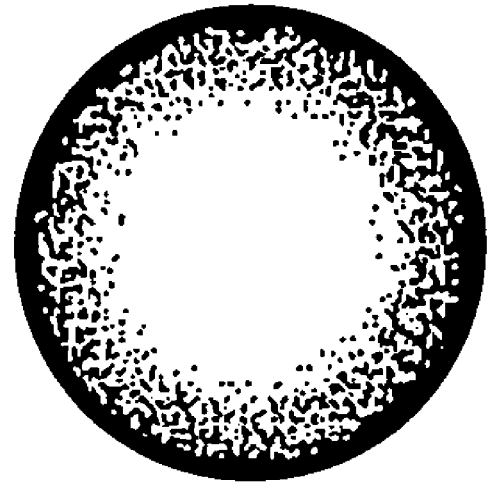
FIG. 7A and FIG. 7B are drawings showing temperature distributions in end faces of alkali-encapsulated cells.
Figure 7B:
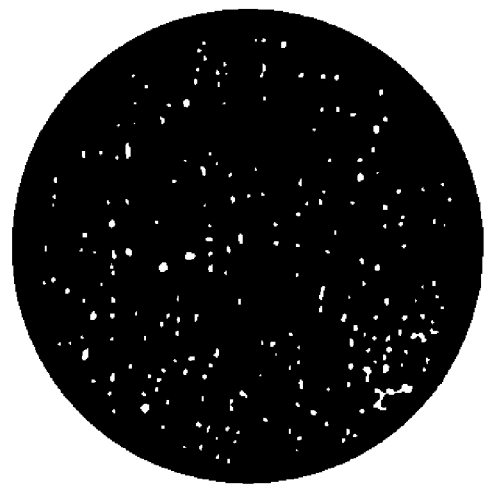

FIG. 7A and FIG. 7B are drawings showing temperature differences in the end faces 10a, 10b of the alkali-encapsulated cell 10 by density differences. Specifically, the denser (or the darker), the higher the temperature; the lighter (or the paler), the lower the temperature. FIG. 7A shows a temperature distribution in a configuration wherein each heater has no extending portion, and FIG. 7B a temperature distribution in a configuration wherein each heater has the extending portion. As shown in FIG. 7A, where each heater 11, 12 does not have the extending portion 11C, 12C, the temperature in the central region is lower than the temperature in the peripheral region in the end faces 10a, 10b. On the other hand, as shown in FIG. 7B, where each heater 11, 12 has the extending portion 11C, 12C, the temperature is uniformly distributed in the central region and the peripheral region in each end face 10a, 10b.

The spacers 13, 14 with thermal conductivity are fitted in the respective spaces between the alkali-encapsulated cell 10 and each heater 11, 12. Since these spacers 13, 14 have elasticity, they are closely fitted in the spaces between the cell 10 and the heaters 11, 12. Since the spacers 13, 14 with thermal conductivity enhance the adhesion between the alkali-encapsulated cell 10, the spacers 13, 14, and the heaters 11, 12 in this manner, the alkali-encapsulated cell 10 can be efficiently heated by the heaters 11, 12. Since the spacers achieve the adhesion between the three members, each end face 10a, 10b can have the temperature distribution with better uniformity.

Each of the lengths $h_1$, $h_2$ in the extending direction of the penetrating spaces 11A, 12A, of the extending portions 11C, 12C of the respective heaters 11, 12 is preferably not less than 0.5 times and not more than 1.5 times the diameter $d_1$, $d_2$ of the corresponding end faces 10a, 10b of the alkali-encapsulated cell 10. Namely, if each of the lengths $h_1$, $h_2$ of the extending portions 11C, 12C is less than 0.5 times the diameter $d_1$, $d_2$ of the corresponding end face 10a, 10b, the temperature of the central region of each end face 10a, 10b can be significantly lower than the temperature of the peripheral region. On the other hand, if each of the lengths $h_1$, $h_2$ of the extending portions 11c, 12C is more than 1.5 times the diameter $d_1$, $d_2$ of the corresponding end face 10a, 10b, the heaters 11, 12 can block the pump light $l_1$ to irradiate the alkali metal vapor G in the alkali-encapsulated cell 10. When each of the lengths $h_1$, $h_2$ of the extending portions 11C, 12C is not less than 0.5 times and not more than 1.5 times the diameter $d_1$, $d_2$ of the corresponding end face 10a, 10b of the alkali-encapsulated cell 10, each end face 10a, 10b can be suitably heated across the entire surface while preventing the heaters 11, 12 from blocking the pump light $l_1$ to irradiate the alkali metal vapor G in the cell 10, accordingly.

Since the alkali laser apparatus uses the alkali metal vapor as a laser medium, it generates less heat than the solid-state lasers and suppresses occurrence of the problem due to heat. Therefore, the alkali laser apparatus 1 according to the present embodiment can realize the high-power, compact laser apparatus while preventing the occurrence of the problem due to heat.

The conceivable reason why the alkali laser apparatus 1 generates less heat is as follows. Namely, when the laser efficiency η of the alkali laser apparatus represented by Eq. (1) below is investigated, the alkali laser apparatus can demonstrate high laser efficiencies.

$$\eta = E_1/E_2 \qquad (1)$$

$E_1$, $E_2$: excited states of alkali metal

For example, a Cs laser apparatus using the metal Cs in the alkali-encapsulated cell 10 demonstrates the laser efficiency η of about 95%. In another example, an Rb laser apparatus using the metal Rb in the alkali-encapsulated cell 10 demonstrates the laser efficiency η of about 98%. As in these examples, the alkali laser apparatus 1 generally exhibits a very high laser efficiency. It is believed that generation of heat is well suppressed in the alkali laser apparatus 1 by virtue of the high laser efficiency.

As described above, the alkali laser apparatus 1 having the alkali-encapsulated cell 10 with the heaters 11, 12 can realize the compact, inexpensive, and high-power laser apparatus with high beam quality. Therefore, the alkali laser apparatus 1 is suitably applicable, for example, widely in industrial fields including the laser machining field.

In the present embodiment the pump light emitter 2 is provided with the volume Bragg grating 24. For this reason, the pump light emitter 2 is able to emit the pump light $l_1$ with a narrow spectral width and a high peak intensity. Since the width of the absorption spectrum of the alkali metal is very narrow, light with the narrow spectral width is suitable for the pump light.

Figure 8:
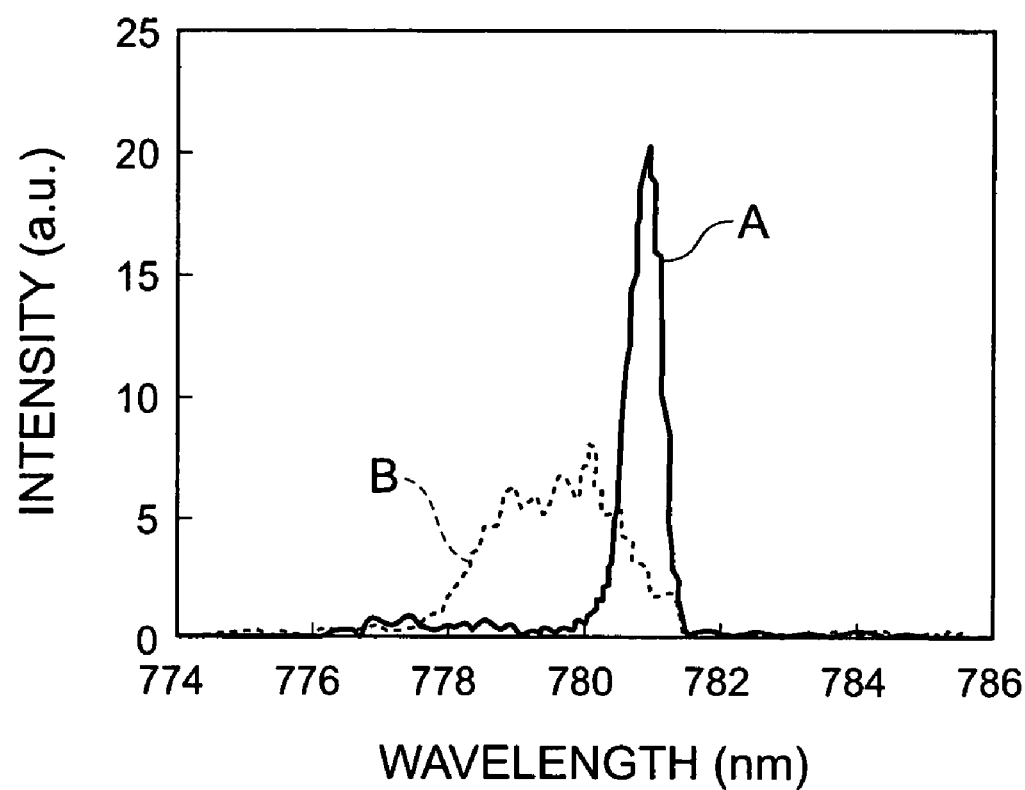
FIG. 8 is a graph showing spectra of output light from semiconductor lasers.

FIG. 8 is a graph showing spectra of output light from semiconductor lasers. In the graph of FIG. 8, the horizontal axis represents wavelengths, and the vertical axis intensities (a.u.). In the graph of FIG. 8, graph A indicated by a solid line shows a case with the volume Bragg grating, and graph B indicated by a dashed line shows a case without the volume Bragg grating. It is seen from a comparison between the graphs A and B of FIG. 8 that graph A has a narrower spectral width and a higher peak intensity than graph B. Therefore, the provision of the volume Bragg grating can narrow the spectral width of output light and increase the peak intensity.

Figure 9:
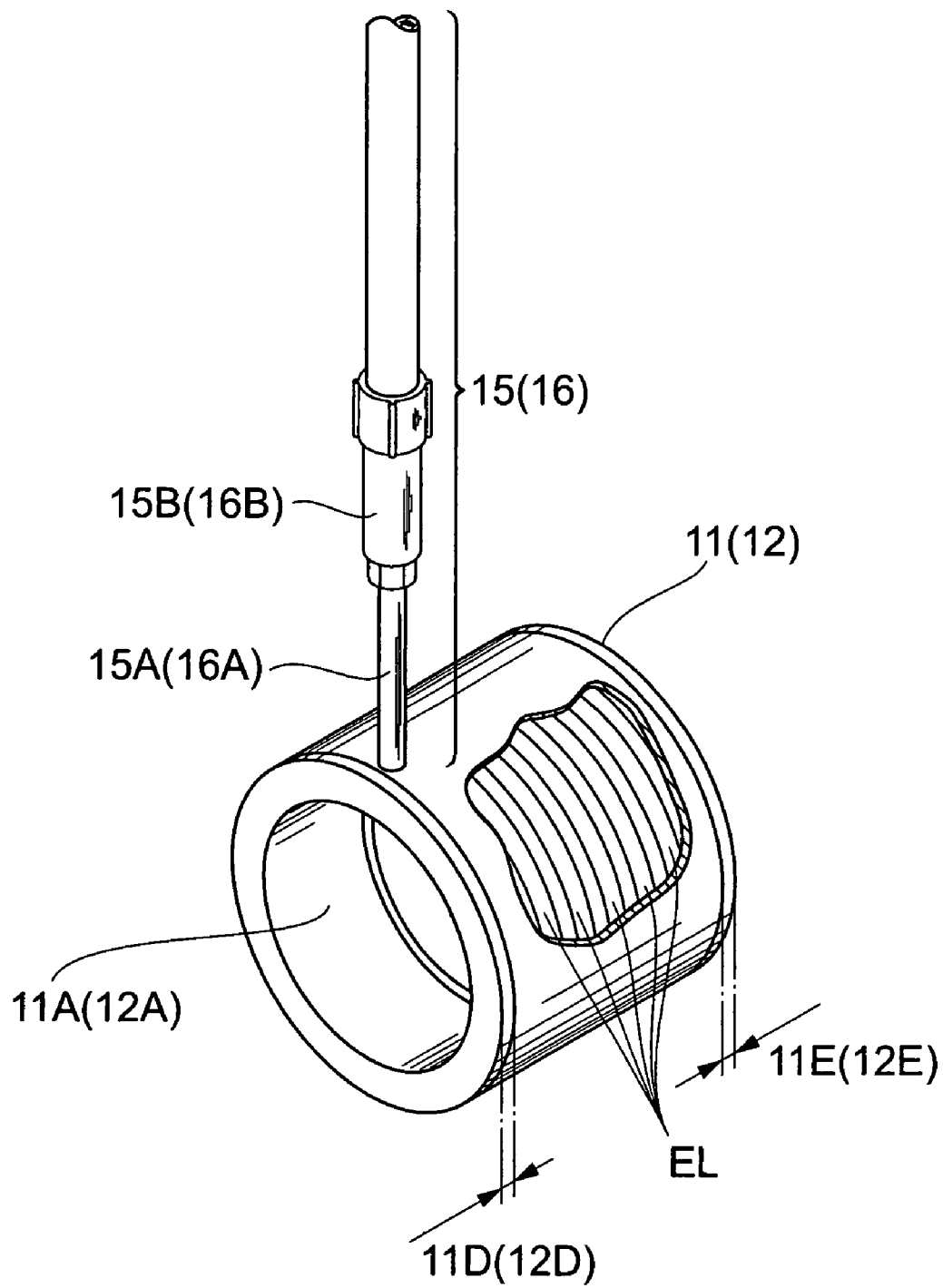
FIG. 9 is a perspective view of a ring heater used in an example.

Subsequently, an example of the alkali laser apparatus according to the embodiment will be described. A glass cell with each end face 10a, 10b in the diameter (outside diameter) of 20 mm was prepared as the alkali-encapsulated cell 10. Ring heaters were used as the first and second heaters 11, 12. The first and second heaters 11, 12 were arranged in the alkali-encapsulated cell so that each of the lengths of the extending portions 11C, 12C in the extending direction of the penetrating space 11A, 12A was 20 mm (i.e., 1.0 times the diameter of each end face 10a, 10b). FIG. 9 is a perspective view of a ring heater for the heaters 11, 12 used in the example. In FIG. 9, the exterior surface of the ring heater is shown as partly broken. The ring heater 11 (12) is provided with a lead 15, 16 having a non-heating portion 15A (16A) and an adaptor portion 15B (16B). The ring heater 11 (12) is a circular cylinder made of brass and its exterior surface is covered by a stainless steel cover. Non-heating portions 11D, 11E about 1 mm long are provided at the two ends, respectively, in the extending direction of the penetrating space 11A (12A). The ring heater 11 (12) used was a heater in which the wattage density can be divided. An electric line EL is arranged along the internal wall inside the ring heater 11 (12).

A mixture of He and ethane gases and the metal Cs were encapsulated under the pressure of 600 Torr in the alkali-encapsulated cell 10. The He and ethane mixture is the buffer gas. The alkali-encapsulated cell 10, in which the He and ethane mixture and the metal Cs were encapsulated, was heated to about 120° C. to generate the Cs vapor in the cell 10.

According to the absorption spectrum of Cs atoms, semiconductor lasers to emit the laser light at the wavelength of 852 nm were used for the semiconductor laser array 21 of the pump light emitter 2. The semiconductor laser array 21 was operated in the quasi-CW operation.

Figure 10:
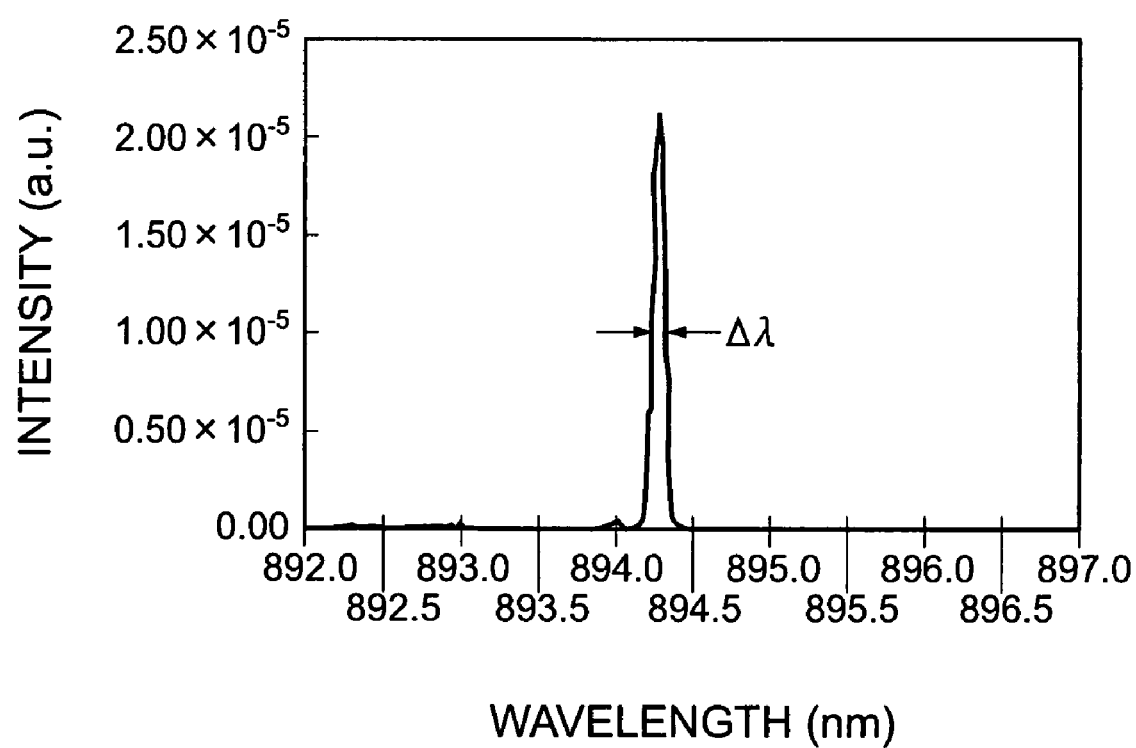
FIG. 10 is a graph showing a spectrum of output laser light from the alkali laser apparatus in the example.

FIG. 10 shows a spectrum of the laser light emitted from the alkali laser apparatus embodied in this manner. In the graph of FIG. 10, the horizontal axis represents wavelengths (nm) and the vertical axis intensities (a.u.). The graph of FIG. 10 is the spectrum obtained in the case where the electric current fed to the semiconductor array is 100 A, the temperature is 30° C., and the Duty ratio at 1 kHz is 5%. The peak wavelength of the spectrum of the laser light is 895 nm, which corresponds to the energy difference between the excited state $E_1$ ($^2P_{1/2}$) and the ground state $E_0$ ($^2S_{1/2}$) of Cs atoms. The spectral width $\Delta\lambda$ is extremely narrow, not more than the resolving power of a spectrum analyzer used in the measurement.

Figure 11:
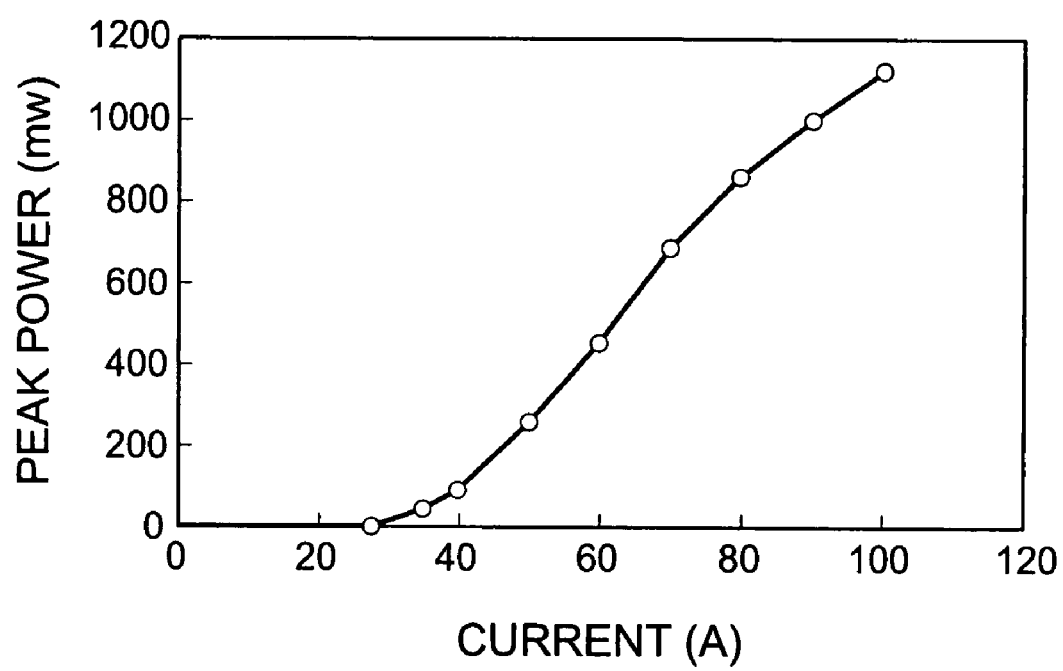
FIG. 11 is a graph showing a relation between electric current fed to a pumping semiconductor laser array and peak power of Cs laser.

FIG. 11 is a graph showing a relation between the electric current fed to the semiconductor laser array 21 and the peak power of the Cs laser. It is seen from the graph of FIG. 11 that the peak power of 1 W or more is achieved at the electric current of about 90 A or more supplied to the semiconductor laser array 21. It is, however, considered that higher output powers of the alkali laser apparatus can be achieved by optimization of the optical system, further narrowing of the spectrum of the pump light, increase of the output power of the pumping semiconductor lasers (e.g., stacking of semiconductor laser arrays, or the like), increase of the pressure of the buffer gas encapsulated in the alkali-encapsulated cell, and so on.

The above described the preferred embodiments and example of the present invention, but it is noted that the present invention is by no means intended to be limited to the above embodiments and example and can be modified in many ways. For example, the example used Cs as the alkali metal, but the present invention is also applicable to the alkali laser apparatus using the other alkali metals (Li, Na, K, Rb) as well as Cs. It is, however, desirable to use the pump light of the wavelength matched with the wavelength of the absorption spectrum of the alkali metal used.

The buffer gas B encapsulated in the alkali-encapsulated cell 10 is not always limited to the mixture of He and ethane gases, but, for example, He may be replaced with Ar, Kr, Ne, or Xe. The gas encapsulation pressure in the alkali-encapsulated cell 10 does not always have to be limited to 600 Torr, either, but it may be, for example, less than 600 Torr, or more than 600 Torr. Particularly, where the gases are encapsulated under a high pressure, the spectral width of alkali metal atoms and pump light increases, which leads to an increase in absorption efficiency.

The shape of the alkali-encapsulated cell 10 is not limited to that presented in the foregoing embodiment, but may be any other shape, e.g., a triangular prism, a rectangular prism, and so on. Accordingly, the shape of the end faces 10a, 10b of the alkali-encapsulated cell 10 is not limited to the circular shape, either, but may be an elliptical, triangular, quadrilateral, or other shape. Furthermore, the shape of the first and second heaters 11, 12, without having to be limited to that presented in the above embodiment, may also be, for example, a triangular prism shape internally having a penetrating space, a rectangular prism shape internally having a penetrating space, or the like. It is also noted that the shape of the heaters 11, 12 is not limited to that described in the above embodiment and example.

The sizes of the alkali-encapsulated cell 10 and the heaters 11, 12 are not limited to those described in the example.

The alkali-encapsulated cell 10 does not always have to be made of glass but may be made, for example, of metal or any other material as long as the entrance and exit faces for the pump light transmit the pump light and the entrance and exit faces for the laser light transmit the laser light. Particularly, where the pressure in the alkali-encapsulated cell 10 is higher than the atmospheric pressure, it is preferable to use a cell made of a strong material such as metal.

In the embodiment the polarization beam splitter 5 is used to separate the pump light $l_1$ and the laser light $l_2$ from each other to extract the laser light $l_2$, but it is noted that the direction of emergence of the laser light $l_2$ is not limited to that in the embodiment but may be any of various directions.

The configuration of the pump light emitter 2 is not limited to that in the embodiment, but the pump light emitter 2 does not always have to be equipped with all of the semiconductor laser array 21, FAC lens 22, beam rotating lens 23, volume Bragg grating 24, and SAC lens 25, for example. The semiconductor lasers do not have to be of the array, but may be, for example, a semiconductor laser chip with a semiconductor laser, a semiconductor laser bar consisting of a line of semiconductor laser chips, a semiconductor laser stack consisting of a stack of semiconductor laser bars, or the like.

In another configuration, the alkali laser apparatus 1 may use, for example, output light from a titanium sapphire laser as the pump light, instead of the output light from the semiconductor lasers. Since the titanium sapphire laser is able to emit a laser beam with a tunable wavelength and a very narrow spectral width, it is suitable in that it is easy to match the wavelength of the pump light with the wavelength of the absorption spectrum of alkali metal atoms. On the other hand, the semiconductor lasers are preferable in that the apparatus can be constructed in a more compact structure and at lower cost than with the titanium sapphire lasers.

It is also noted that the alkali laser apparatus 1 does not always have to be equipped with the spacers 13, 14 fitted between the alkali-encapsulated cell 10 and the first and second heaters 11, 12.

Each of the lengths $h_1$, $h_2$ in the extending direction of the penetrating spaces 11A, 12A, of the extending portions 11C, 12C of the respective heaters 11, 12 may be less than 0.5 times or more than 1.5 times the diameter $d_1$, $d_2$ of the corresponding end face 10a, 10b of the alkali-encapsulated cell 10.

The alkali laser apparatus 1 may be constructed without the half wave plate 3. However, where the pump light $l_1$ is separated from the laser light $l_2$ by means of the polarization beam splitter 5, the half wave plate 3 is effectively used in order to enhance the polarized nature of the pump light $l_1$.

INDUSTRIAL APPLICABILITY

The present invention is applicable to the heater-attached alkali-encapsulated cell and alkali laser apparatus capable of heating the alkali-encapsulated cell by the simple configuration.

What is claimed is:

1. A heater-attached alkali-encapsulated cell comprising first and second heaters for heating an alkali-encapsulated cell in which an alkali metal vapor is encapsulated,
    the alkali-encapsulated cell having first and second end faces opposed to each other and transmitting pump light for pumping the alkali metal vapor, and laser light outputted from the alkali metal vapor pumped, and a side face connecting the two end faces;
    wherein a penetrating space extending from one end to another end is formed in each of the first and second heaters;
    wherein the first heater is so arranged that a portion on the first end face side of the alkali-encapsulated cell is inserted in a part of the penetrating space of the first heater and that the rest thereof extends toward a side opposite to the second end face with respect to the first end face; and
    wherein the second heater is separated from the first heater with a predetermined distance between the heaters in an opposing direction of the first and second end faces and is so arranged that a portion on the second end face side of the alkali-encapsulated cell is inserted in a part of the penetrating space of the second heater and that the rest thereof extends toward a side opposite to the first end face with respect to the second end face.

2. The heater-attached alkali-encapsulated cell according to claim 1, further comprising a pair of spacers having thermal conductivity and elasticity and fitted in a space between internal walls of the respective heaters defining the penetrating spaces, and the side face of the alkali-encapsulated cell.

3. The heater-attached alkali-encapsulated cell according to claim 1, further comprising a pair of end face heaters for heating the respective end faces of the alkali-encapsulated cell.

4. The heater-attached alkali-encapsulated cell according to claim 1,
    wherein the first and second end faces both are circular,
    wherein a length of the rest of the first heater in an extending direction of the penetrating space is not less than 0.5 times and not more than 1.5 times a diameter of the first end face, and
    wherein a length of the rest of the second heater in an extending direction of the penetrating space is not less than 0.5 times and not more than 1.5 times a diameter of the second end face.

5. An alkali laser apparatus comprising:
    a cavity having on a resonance path a heater-attached alkali-encapsulated cell; and
    a pump light emitter for emitting the pump light to irradiate the alkali metal vapor,
    wherein the heater-attached alkali-encapsulated cell comprising first and second heaters for heating an alkali-encapsulated cell in which an alkali metal vapor is encapsulated, the alkali-encapsulated cell having first and second end faces opposed to each other and transmitting pump light for pumping the alkali metal vapor, and laser light outputted from the alkali metal vapor pumped, and a side face connecting the two end faces;
    wherein a penetrating space extending from one end to another end is formed in each of the first and second heaters; wherein the first heater is so arranged that a portion on the first end face side of the alkali-encapsulated cell is inserted in a part of the penetrating space of the first heater and that the rest thereof extends toward a side opposite to the second end face with respect to the first end face; and wherein the second heater is separated from the first heater with a predetermined distance between the heaters in an opposing direction of the first and second end faces and is so arranged that a portion on the second end face side of the alkali-encapsulated cell is inserted in a part of the penetrating space of the second heater and that the rest thereof extends toward a side opposite to the first end face with respect to the second end face.

6. The alkali laser apparatus according to claim 5,
    wherein the pump light emitter has:
    a light source comprised of a semiconductor laser;
    a condenser optical system for condensing light emitted from the light source;
    a rotating optical system for rotating the light condensed by the condenser optical system; and
    a volume Bragg grating for narrowing a width of a wavelength spectrum of the light rotated by the rotating optical system.

* * * * *